US008305752B2

(12) United States Patent
Ke et al.

(10) Patent No.: US 8,305,752 B2
(45) Date of Patent: Nov. 6, 2012

(54) AIR DUCT AND ELECTRONIC DEVICE INCORPORATING THE SAME

(75) Inventors: Chih-Wei Ke, Taipei Hsien (TW); Hao-Der Cheng, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 228 days.

(21) Appl. No.: 12/909,824

(22) Filed: Oct. 21, 2010

(65) Prior Publication Data

US 2012/0026680 A1 Feb. 2, 2012

(30) Foreign Application Priority Data

Jul. 27, 2010 (TW) .................................. 99124627

(51) Int. Cl.
*H05K 7/20* (2006.01)
*F28F 7/00* (2006.01)
(52) U.S. Cl. ................... 361/679.49; 361/695; 165/80.2
(58) Field of Classification Search ............ 361/679.49–679.51, 695; 165/80.2, 165/185; 257/713, 721; 174/16.1
See application file for complete search history.

(56) References Cited

U.S. PATENT DOCUMENTS

| 5,822,188 | A  | * | 10/1998 | Bullington | 361/695 |
| 5,852,547 | A  | * | 12/1998 | Kitlas et al. | 361/695 |
| 6,094,345 | A  | * | 7/2000 | Diemunsch | 361/695 |
| 6,400,568 | B1 | * | 6/2002 | Kim et al. | 361/697 |
| 7,403,387 | B2 | * | 7/2008 | Pav et al. | 361/694 |
| 2006/0061966 | A1 | * | 3/2006 | Korinsky et al. | 361/695 |
| 2007/0091566 | A1 | * | 4/2007 | Sun | 361/695 |
| 2008/0101018 | A1 | * | 5/2008 | Long et al. | 361/695 |
| 2008/0117589 | A1 | * | 5/2008 | Carrera et al. | 361/687 |
| 2012/0008276 | A1 | * | 1/2012 | Cheng | 361/679.48 |

* cited by examiner

*Primary Examiner* — Zachary M Pape
(74) *Attorney, Agent, or Firm* — Altis Law Group, Inc.

(57) ABSTRACT

An air duct defines a first air vent and a second air vent at opposite ends thereof, respectively. The air duct includes a duct body and a movable plate. The duct body defines a through opening in a side thereof. The through hole intercommunicates an interior and an exterior of the air duct. The movable plate is mounted on the side of the duct body adjacent to the through opening. By moving the movable plate, the through opening can be changed between an open state and a closed state freely. An electronic device incorporating the air duct is also provided.

16 Claims, 5 Drawing Sheets

AIR DUCT AND ELECTRONIC DEVICE INCORPORATING THE SAME

CROSS-REFERENCE TO RELATED APPLICATION

This application is related to a co-pending application entitled "AIR DUCT AND ELECTRONIC DEVICE USING THE SAME" (Ser. No. 12/909,804), assigned to the same assignee of this application and filed on the same date as this application. The related application is incorporated herein by reference.

BACKGROUND

1. Technical Field

The disclosure generally relates to dissipation of heat from electronic devices, and more particularly to an air duct and an electronic device incorporating the air duct.

2. Description of Related Art

It is well known that heat is generated by many kinds of electronic components, such as integrated circuit chips and memory cards, during their operation. If the heat is not efficiently removed, the electronic components may suffer damage. Typically, a cooling fan is provided to produce airflow over and through the electronic components. An air duct may also be provided to cover one of the electronic components and guide the airflow to cool the electronic component in the air duct. However, in such arrangement, other electronic components outside the air duct cannot be efficiently cooled.

What is needed, therefore, is an air duct and an electronic device incorporating the air duct which can overcome the described limitations.

BRIEF DESCRIPTION OF THE DRAWINGS

Many aspects of the present embodiments can be better understood with reference to the following drawings. The components in the drawings are not necessarily drawn to scale, the emphasis instead placed upon clearly illustrating the principles of the present embodiments. Moreover, in the drawings, like reference numerals designate corresponding parts throughout the various views.

DETAILED DESCRIPTION

Figure 1:
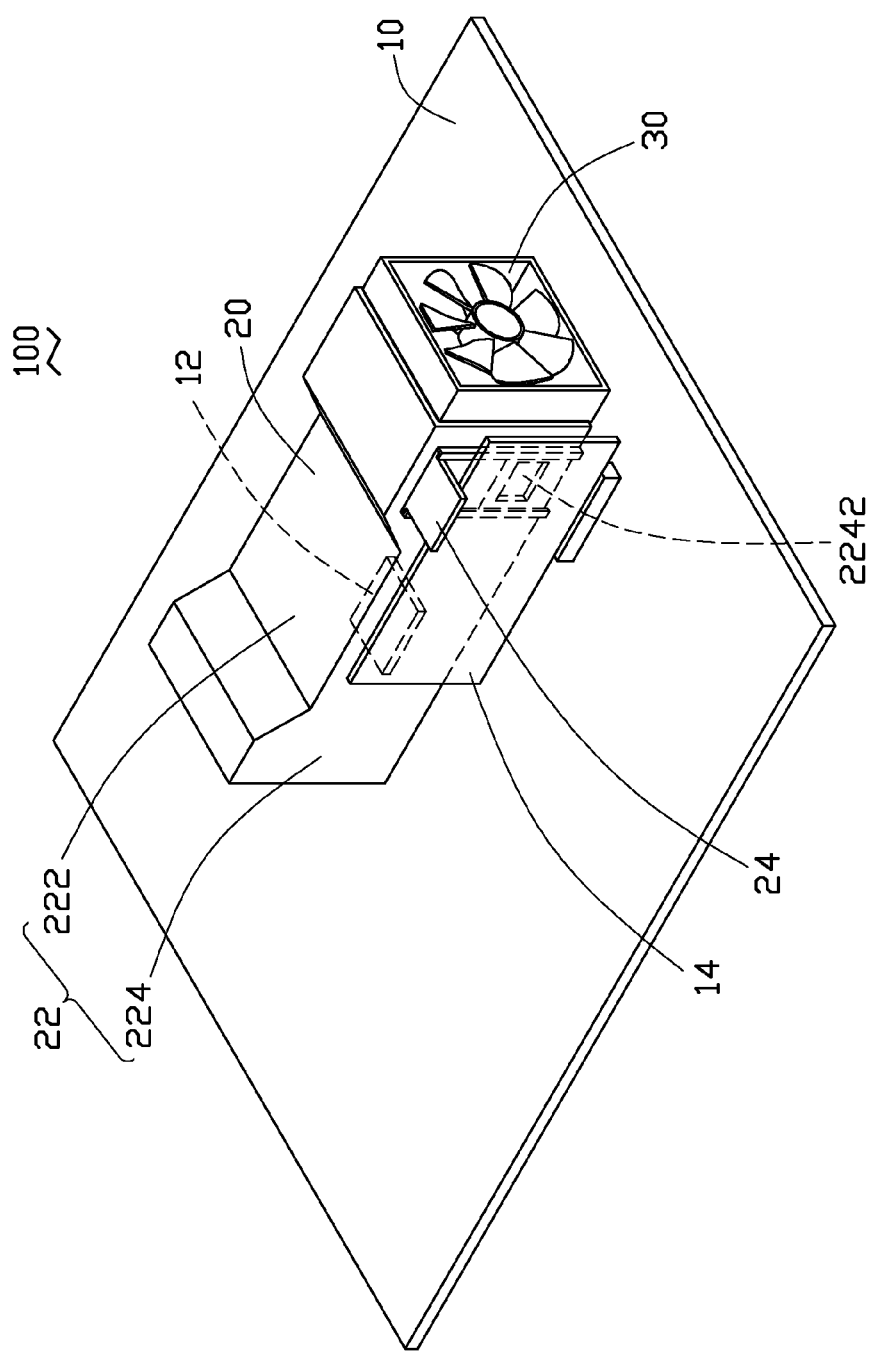
FIG. 1 is an assembled, isometric view of an electronic device of a first exemplary embodiment of the disclosure.

Referring to FIG. 1, an electronic device 100 in accordance with a first exemplary embodiment of the disclosure is shown. The electronic device 100 can be a computer, a server or other device. The electronic device 100 includes a circuit board 10, an air duct 20 and a cooling fan 30.

The circuit board 10 has a plurality of electronic components mounted thereon. In this embodiment, a first electronic component, such as a central processing unit (CPU) 12, and a second electronic component, such as an expansion card 14 (e.g., a graphics card, a memory card, etc), are mounted on the circuit board 10. The expansion card 14 is spaced from the CPU 12. A bottom end of the expansion card 14 is received in a peripheral component interconnect (PCI) slot (not labeled) mounted on the circuit board 10.

The air duct 20 is mounted on the circuit board 10. The CPU 12 is disposed inside the air duct 20, and the expansion card 14 is disposed outside the air duct 20. In the illustrated embodiment, the expansion card 14 is parallel to the air duct 20. The air duct 20 includes a duct body 24, and a movable plate 24 mounted on the duct body 22.

Figure 2:
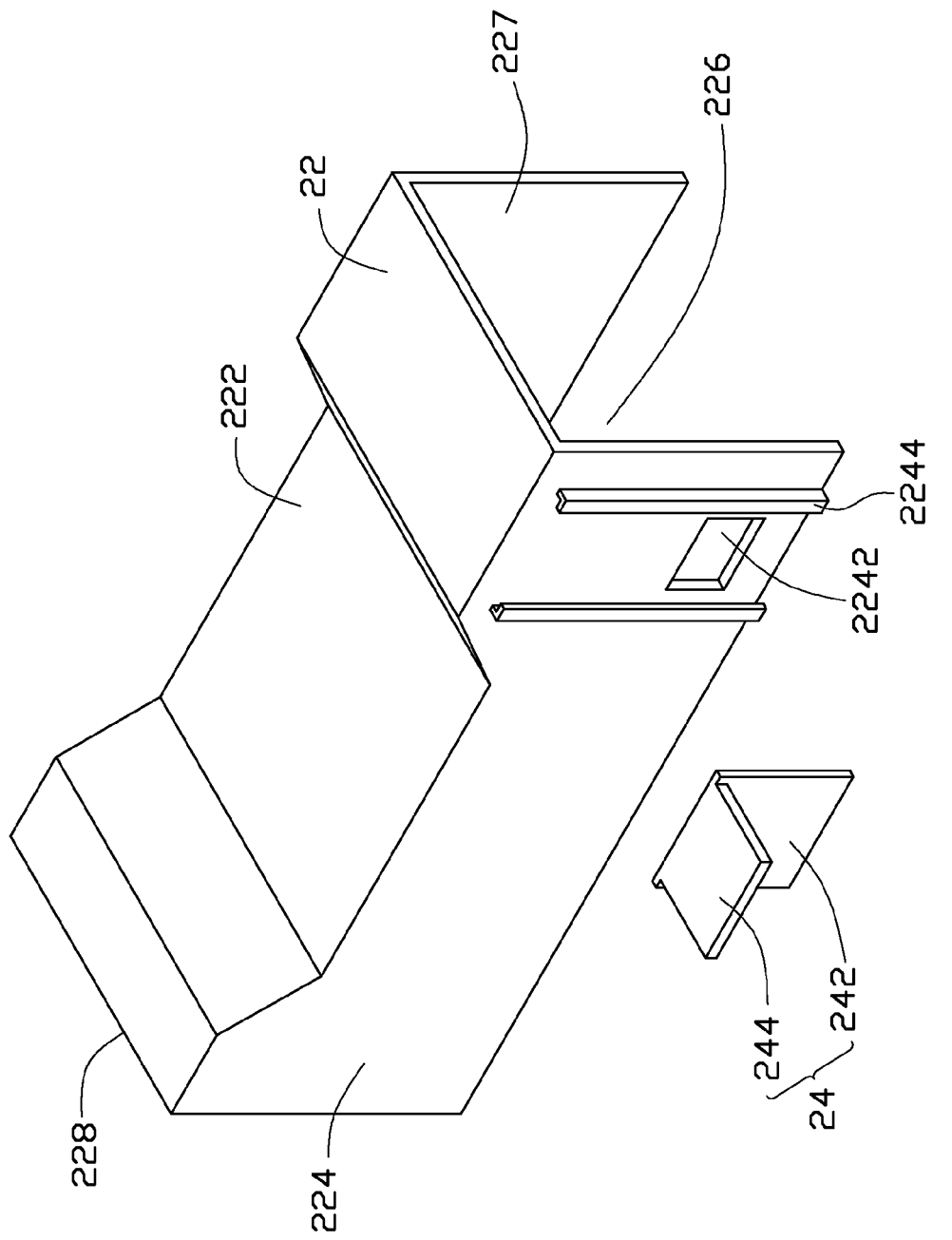
FIG. 2 is an exploded, isometric view of an air duct of the electronic device of FIG. 1.

Referring also to FIG. 2, a transverse section of the air duct 20 is substantially U-shaped. The air duct 20 includes a top plate 222, and two side plates 224 depending from opposite sides of the top plate 222, respectively. Alternatively, the air duct 20 can be a hollow cylinder, a curved bridge, or another shape. The top plate 222 and the side plates 224 cooperatively define an air passage 226 therebetween. The air duct 20 defines a first air vent and a second air vent at opposite ends of the air passage 226, respectively. In this embodiment, the first air vent adjacent to the expansion card 14 functions as an air outlet 227, and the second air vent farthest from the expansion card 14 functions as an air inlet 228.

Figure 3:
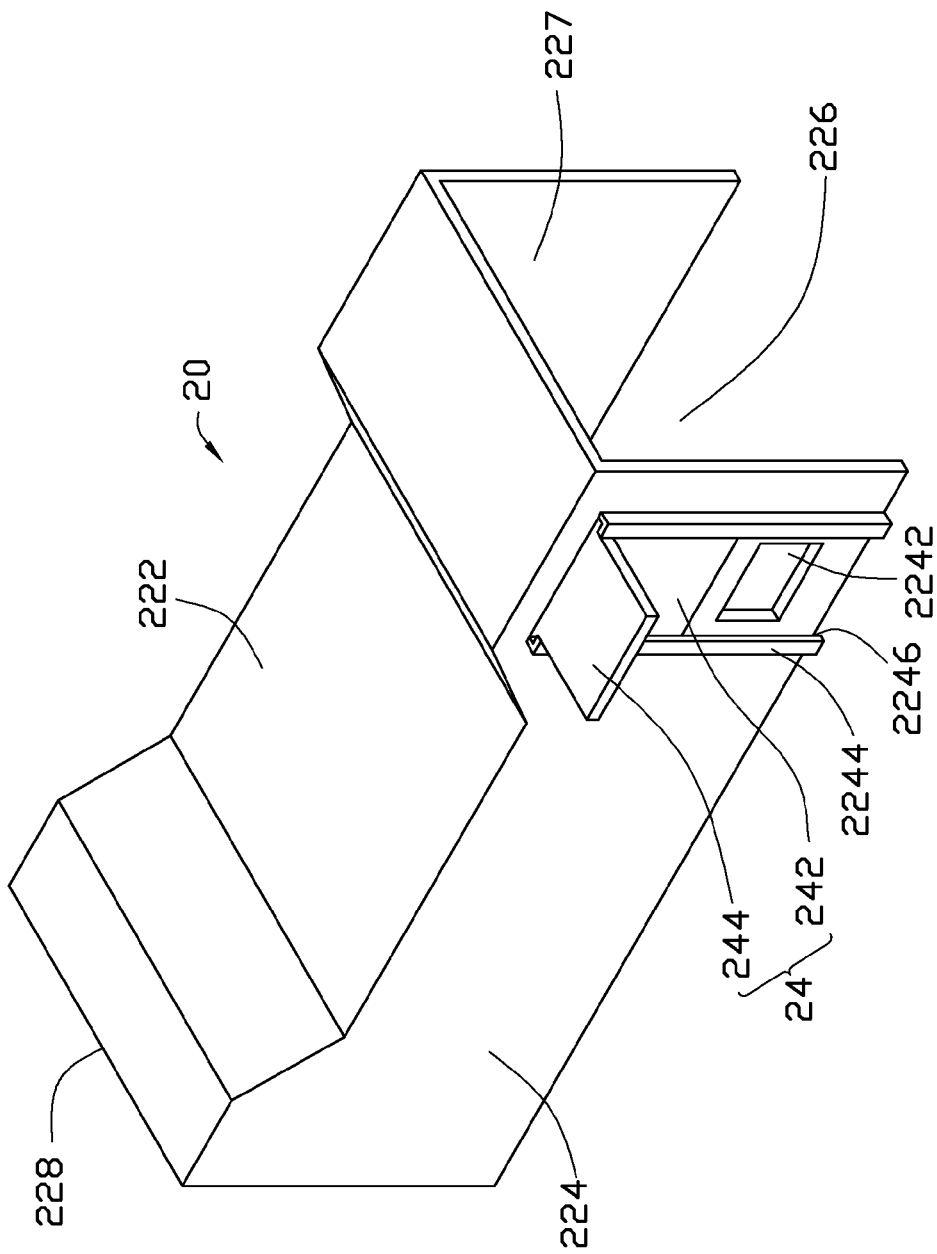
FIG. 3 is an assembled view of the air duct shown in FIG. 2, wherein a through opening of the air duct is open.

The top plate 222 has a saddle shape, with a middle portion thereof located lower than two end portions thereof. Two sloped portions of the top plate 222 are located between ends of the middle portion and the two end portions. The air duct 20 defines a through opening 2242 in one of the side plates 224 facing the expansion card 14. The through opening 2242 is located adjacent to the air outlet 228. The side plate 224 with the through opening 2242 forms two elongated mounting strips 2244 at two opposite sides of the through opening 2242, respectively. The mounting strips 2244 are vertical and parallel to each other. Top and bottom ends of each of the mounting strips 2244 longitudinally exceed the through opening 2242. Referring also to FIG. 3, each mounting strip 2244 has an L-shaped transverse cross section, whereby each mounting strip 2244 and the side plate 224 cooperatively define a guiding groove 2246 therebetween. The guiding grooves 2246 of the mounting strips 2244 face each other. That is, the mounting strips 2244 are oriented symmetrically opposite each other.

The movable plate 24 is substantially L-shaped, and includes a baffle plate 242 and an operating plate 244 extending out from a top end of the baffle plate 242. The baffle plate 242 is generally rectangular. A width of the baffle plate 242 is substantially equal to a maximum horizontal distance between the mounting strips 2244 at the guiding grooves 2246. A height of the baffle plate 242 exceeds that of the through opening 2242. The baffle plate 242 has a thickness substantially equal to a depth of each guiding groove 2246 as measured perpendicular to the side plate 224, such that the baffle plate 242 can be slidably received in the guiding grooves 2246. The operating plate 244 is substantially rectangular, and extends from a middle portion of the top end of the baffle plate 242 to a point exceeding the expansion card 14. The operating plate 244 is narrower than a minimum distance between the mounting strips 2244.

The cooling fan 30 is mounted on the circuit board 10 at the air outlet 228 of the air duct 20, and is for drawing airflow out of the air duct 20 through the air outlet 228. Alternatively, the cooling fan 30 can generate airflow toward the air duct 20, wherein the first and second air vents of the air duct 20 function as an air inlet and an air outlet, respectively.

During assembly of the air duct 20, two opposite lateral sides of the baffle plate 242 of the movable plate 24 are inserted into the guiding grooves 2246 of the mounting strips 224, respectively, via top ends of the guiding grooves 2246.

Referring to FIGS. 1 and 3, when the expansion card 14 is preassembled at an exterior of the air duct 20, the operating plate 244 abuts a top end of the expansion card 14, and the movable plate 22 cannot slide downwardly due to the expansion card 14 supporting the operating plate 244. At this time, the baffle plate 242 is located above the through opening 2242, and thus the through opening 2242 is open. During operation of the cooling fan 30, air is drawn into the air passage 226 through the air inlet 228 of the air duct 20 by the cooling fan 30, and such airflow carries heat generated by the CPU 12 in the air duct 20 toward the air outlet 227. Additional air is drawn along (and through) the expansion card 14 adjacent to the through opening 2242 of the air duct 20 by the cooling fan 30, and such airflow carries heat generated by the expansion card 14. The additional air enters the air passage 226 through the through opening 2242 and proceeds toward the air outlet 228. The air flowing toward the air outlet 228 is drawn out of the air duct 20 by the cooling fan 30.

Figure 4:
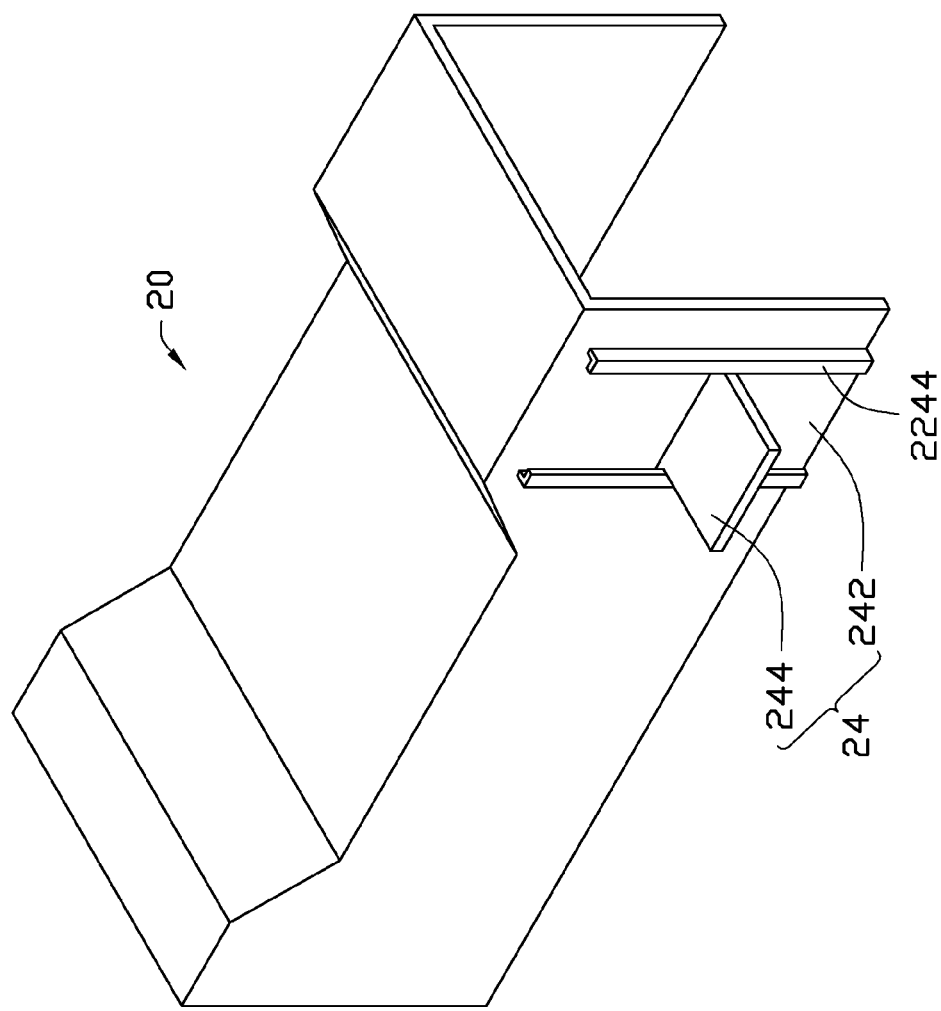
FIG. 4 is similar to FIG. 3, but shows the through opening of the air duct closed.

Referring to FIG. 4, this shows an arrangement when no electronic component, i.e., expansion card, needs to be cooled at the exterior of the air duct 20. The operating plate 244 is slid to a bottom end of the mounting strips 2244 along the guiding grooves 2246, and seals the through opening 2242. Thus at this time, the through opening 2242 is closed. During operation of the cooling fan 30, air is drawn into the air passage 226 through the air inlet 228 of the air duct 20 by the cooling fan 30, and such airflow carries the heat generated by the CPU 12 in the air duct 20 toward the air outlet 227. The air flowing toward the air outlet 227 is drawn out of the air duct 20 by the cooling fan 30.

In the electronic device 100, the movable plate 24 is provided adjacent to the through opening 2242. By moving the movable plate 24, the through opening 2242 can be easily changed between an open state and a closed state. Therefore, when an electronic component, such as the expansion card 14, is to be cooled at the exterior of the air duct 20, the through opening 2242 is open, and the airflow produced by the cooling fan 30 can evacuate the heat generated by the electronic component through the through opening 2242. When no electronic component is to be cooled at the exterior of the air duct 20, the through opening 2242 is closed, and the airflow produced by the cooling fan 30 can be exclusively the airflow toward the electronic component, such as the CPU 12, in the air duct 20. Thus, the heat dissipation efficiency and the adaptability of the electronic device 100 are improved. In addition, when the through opening 2242 is open, the operating plate 244 abutting the top end of the expansion card 14 can help guide some of the airflow toward the through opening 2242. This facilitates air to flow along other portions of the expansion card 14 toward the through opening 2242. Thus, the heat generated by the expansion card 14 can be taken away more efficiently.

Figure 5:
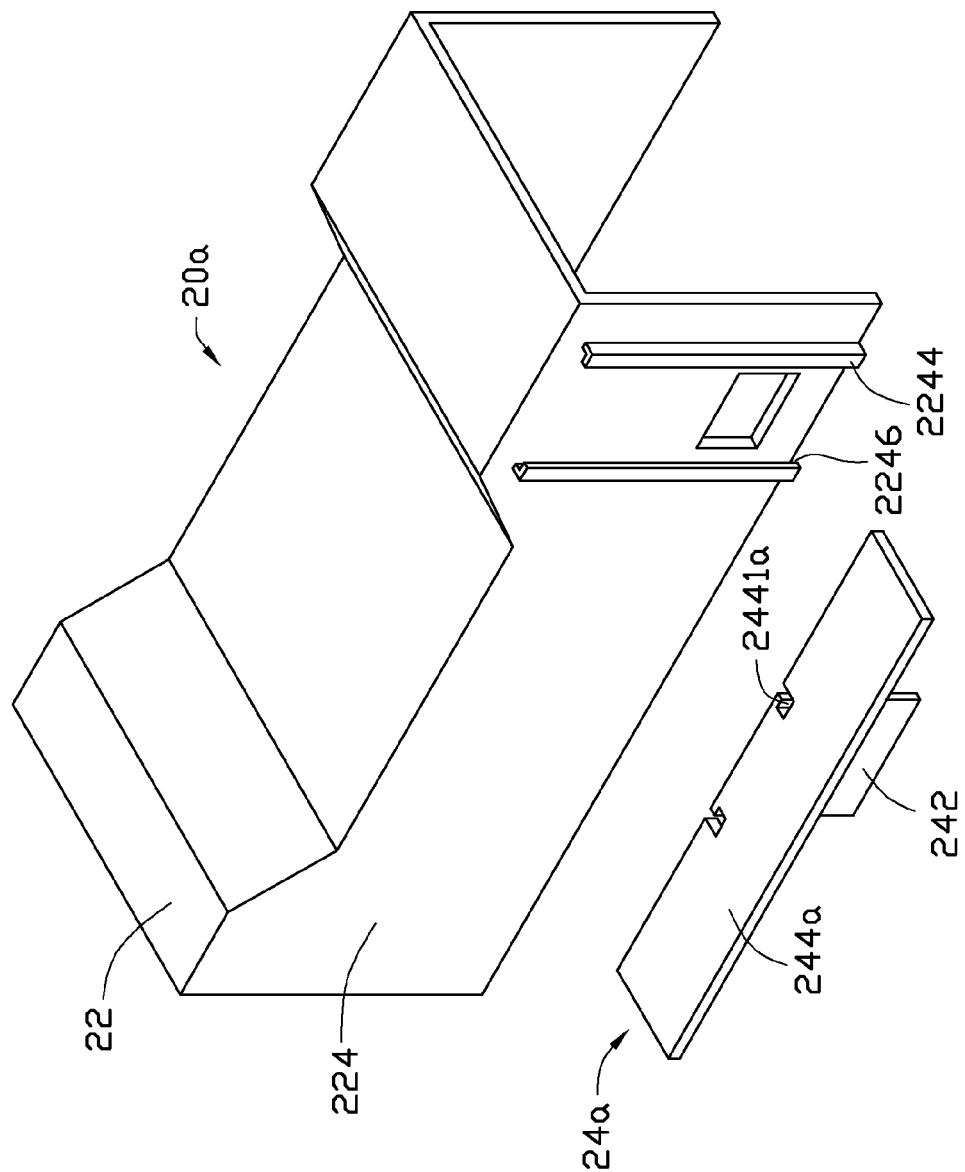
FIG. 5 is an exploded, isometric view of an air duct of an electronic device of a second exemplary embodiment of the disclosure.

Referring to FIG. 5, an air duct 20a in accordance with a second exemplary embodiment of the disclosure is shown. The air duct 20a differs from the air duct 20 of the first embodiment only in the following respects.

An operating plate 244a of a moveable plate 24a of the air duct 20a is substantially rectangular and elongated. The operating plate 244a exceeds the baffle plate 242 in both directions parallel to the side plate 224, and has a length similar to that of the expansion card 14. In other embodiments, the length of the operating plate 244a may be substantially equal to that of the expansion card 14. The operating plate 244a defines two engaging grooves 2441a at opposite sides of a top end of the baffle plate 242, respectively. The engaging grooves 2441a are L-shaped, and the L-shaped mounting strips 2244 are moveably received in the engaging grooves 2441a, respectively. The operating plate 244a abuts and covers the top end of the expansion card 14, and an inner side of the operating plate 244a abuts (e.g., contacts) the side plate 224 of the air duct 20a. With such configuration, the elongated operating plate 244a can further help guide the nearby air to flow toward the through opening 2242. This facilitates air to flow along other portions of the expansion card 14 toward the through opening 2242. Thus, the heat generated by the expansion card 14 can be taken away more efficiently.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An air duct comprising:
 a first air vent and a second air vent at opposite ends thereof;
 a duct body defining a through opening in a side thereof, the through opening intercommunicating an interior and an exterior of the air duct; and
 a movable plate mounted on the side of the duct body adjacent to the through opening, the through opening changeable between an open state and a closed state by moving the movable plate;
 wherein the duct body comprises a top plate and two side plates depending from the top plate, and the through opening is defined in one of the side plates; and
 wherein the movable plate comprises a baffle plate and an operating plate extending from the baffle plate, the side plate with the opening forms two mounting strips at opposite lateral sides of the through opening, respectively, the side plate with the opening and each of the mounting strips cooperatively define a guiding groove therebetween, the guiding grooves face each other, and two opposite sides of the baffle plate are received in the guiding grooves, respectively.

2. The air duct of claim 1, wherein the top plate comprises a saddle shape, with a middle portion thereof located lower than two end portions thereof.

3. The air duct of claim 1, wherein the baffle plate is moveable in the guiding grooves to change the through opening between open and closed.

4. The air duct of claim 3, wherein the operating plate is narrower than a minimum distance between the mounting strips.

5. The air duct of claim 3, wherein the operating plate is elongated, and exceeds the baffle plate in both directions parallel to the side plate with the through hole, the operating plate defines two engaging grooves at opposite sides of the baffle plate, respectively, and the mounting strips are slidably received in the engaging grooves, respectively.

6. The air duct of claim 5, wherein each of the engaging grooves and the mounting strips comprises an L-shaped transverse cross section.

7. The air duct of claim 1, wherein the through opening is located adjacent to one of the first and second air vents.

8. An electronic device comprising:
 a circuit board comprising an electronic component mounted thereon;
 an air duct mounted on the circuit board, the air duct comprising:

a first air vent and a second air vent at opposite ends thereof, respectively;

a duct body defining a top plate and two side plates depending from the top plate, a through opening defined in one of the side plates, the through opening intercommunicating an interior and an exterior of the air duct, the electronic component disposed in the duct body; and a movable plate mounted on the duct body, the moveable plate disposed adjacent to the through opening, the through opening changeable between an open state and a closed state by moving the movable plate; and a cooling fan located on the circuit board and facing the first air vent of the air duct and; wherein the movable plate comprises a baffle plate and an operating plate extending from the baffle plate, the side plate with the opening forms two mounting strips at opposite lateral sides of the through opening, respectively, the side plate with the opening and each of the mounting strips cooperatively define a guiding groove therebetween, the guiding grooves face each other, and two opposite sides of the baffle plate are moveably received in the guiding grooves, respectively, to change the through opening between the open and closed states.

9. The electronic device of claim 8, wherein the circuit board further comprises another electronic component mounted thereon, disposed at the exterior of the air duct and facing the through opening, and the movable plate is located at a position to ensure that the through opening is open.

10. The electronic device of claim 9, wherein the electronic component in the air duct is a CPU, and the other electronic component at the exterior of the air duct is an expansion card.

11. The electronic device of claim 8, wherein the operating plate is narrower than a minimum distance between the mounting strips.

12. The electronic device of claim 8, wherein the operating plate is elongated, and exceeds the baffle plate in both directions parallel to the side plate with the through hole, the operating plate defines two engaging grooves at opposite sides of the baffle plate, respectively, and the mounting strips are slidably received in the engaging grooves, respectively.

13. The electronic device of claim 12, wherein the circuit board further comprises another electronic component housed thereon, disposed at the exterior of the air duct and facing the through opening, the movable plate abuts and covers the other electronic component at the exterior of the air duct, and the through opening is in the open state.

14. The electronic device of claim 13, wherein the operating plate has a length substantially equal to that of the other electronic component at the exterior of the air duct.

15. The electronic device of claim 12, wherein each of the engaging grooves and the mounting strips comprises an L-shaped transverse cross section.

16. The electronic device of claim 8, wherein the through opening is located closer to the first air vent than the second air vent.

* * * * *